United States Patent
Guo et al.

(10) Patent No.: US 9,793,106 B2
(45) Date of Patent: Oct. 17, 2017

(54) RELIABILITY IMPROVEMENT OF POLYMER-BASED CAPACITORS BY MOISTURE BARRIER

(71) Applicant: Texas Instruments Incorporated, Dallas, TX (US)

(72) Inventors: Honglin Guo, Dallas, TX (US); Tim A. Taylor, Sachse, TX (US); Jeff A. West, Dallas, TX (US); Ricky A. Jackson, Richardson, TX (US); Byron Williams, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/931,822

(22) Filed: Nov. 3, 2015

(65) Prior Publication Data
US 2016/0133689 A1     May 12, 2016

Related U.S. Application Data

(60) Provisional application No. 62/076,265, filed on Nov. 6, 2014.

(51) Int. Cl.
*H01L 49/02*     (2006.01)
*H01G 4/14*     (2006.01)
(Continued)

(52) U.S. Cl.
CPC ......... *H01L 21/02118* (2013.01); *H01G 4/14* (2013.01); *H01G 4/18* (2013.01); *H01G 4/224* (2013.01); *H01L 21/0228* (2013.01); *H01L 21/02164* (2013.01); *H01L 21/02178* (2013.01); *H01L 23/3135* (2013.01); *H01L 23/3192* (2013.01); *H01L 51/00* (2013.01); *H01L 23/3121* (2013.01); *H01L 23/564* (2013.01); *H01L 24/05* (2013.01); *H01L 24/29* (2013.01);
(Continued)

(58) Field of Classification Search
CPC ..................................................... H01L 28/40
See application file for complete search history.

(56) References Cited

U.S. PATENT DOCUMENTS

| | | | | |
|---|---|---|---|---|
| 2008/0017999 A1* | 1/2008 | Kikuchi | ............. | H01L 23/3128 257/787 |
| 2008/0191253 A1* | 8/2008 | Kikuchi | ............ | H01L 21/76814 257/295 |

(Continued)

FOREIGN PATENT DOCUMENTS

| | | |
|---|---|---|
| CN | 101777424 A | 7/2010 |
| JP | 2004235490 A | 8/2004 |

*Primary Examiner* — Daniel Whalen
(74) *Attorney, Agent, or Firm* — Jacqueline J. Garner; Charles A. Brill; Frank D. Cimino

(57) ABSTRACT

It has been discovered that poor TDDB reliability of microelectronic device capacitors with organic polymer material in the capacitor dielectric is due to water molecules infiltrating the organic polymer material when the microelectronic device is exposed to water vapor in the operating ambient. Water molecule infiltration from water vapor in the ambient is effectively reduced by a moisture barrier comprising a layer of aluminum oxide formed by an atomic layer deposition (ALD) process. A microelectronic device includes a capacitor with organic polymer material in the capacitor dielectric and a moisture barrier with a layer of aluminum oxide formed by an ALD process.

16 Claims, 10 Drawing Sheets

(51) Int. Cl.
*H01L 21/02* (2006.01)
*H01G 4/224* (2006.01)
*H01L 51/00* (2006.01)
*H01G 4/18* (2006.01)
H01L 23/31 (2006.01)
H01L 23/00 (2006.01)

(52) U.S. Cl.
CPC .............. *H01L 24/32* (2013.01); *H01L 24/48* (2013.01); *H01L 24/73* (2013.01); *H01L 28/40* (2013.01); *H01L 2224/02166* (2013.01); *H01L 2224/0345* (2013.01); *H01L 2224/03462* (2013.01); *H01L 2224/03464* (2013.01); *H01L 2224/04042* (2013.01); *H01L 2224/0558* (2013.01); *H01L 2224/05567* (2013.01); *H01L 2224/05568* (2013.01); *H01L 2224/05573* (2013.01); *H01L 2224/05624* (2013.01); *H01L 2224/05644* (2013.01); *H01L 2224/05655* (2013.01); *H01L 2224/05664* (2013.01); *H01L 2224/05669* (2013.01); *H01L 2224/291* (2013.01); *H01L 2224/2919* (2013.01); *H01L 2224/32225* (2013.01); *H01L 2224/48091* (2013.01); *H01L 2224/48247* (2013.01); *H01L 2224/48465* (2013.01); *H01L 2224/73265* (2013.01); *H01L 2224/8592* (2013.01); *H01L 2224/94* (2013.01); *H01L 2924/10253* (2013.01); *H01L 2924/14* (2013.01); *H01L 2924/181* (2013.01)

(56) References Cited

U.S. PATENT DOCUMENTS

| | | | |
|---|---|---|---|
| 2009/0023858 A1 | 1/2009 | Summers et al. | |
| 2009/0236647 A1* | 9/2009 | Barth | H01L 23/49861 257/296 |
| 2011/0062549 A1* | 3/2011 | Lin | H01L 23/3128 257/531 |
| 2011/0100458 A1 | 5/2011 | Kang et al. | |
| 2014/0252547 A1* | 9/2014 | Chen | H01L 27/0805 257/532 |
| 2014/0339530 A1* | 11/2014 | Hente | H01L 51/5253 257/40 |
| 2015/0024607 A1* | 1/2015 | Wang | H01L 21/02318 438/781 |
| 2015/0276430 A1* | 10/2015 | Sekitani | A61B 5/0478 324/609 |
| 2016/0064473 A1* | 3/2016 | Morito | H01L 28/60 257/532 |

* cited by examiner

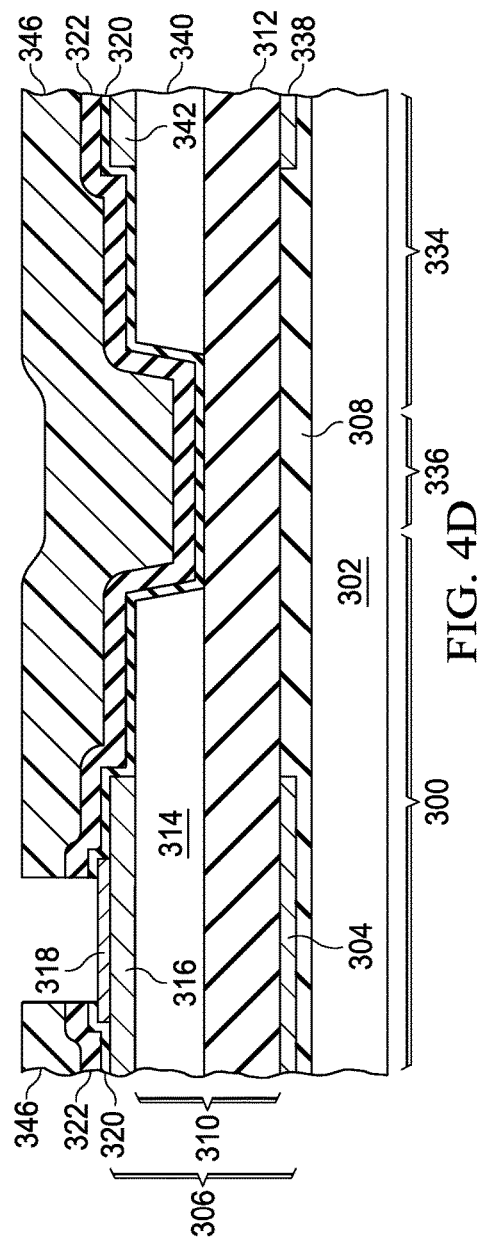
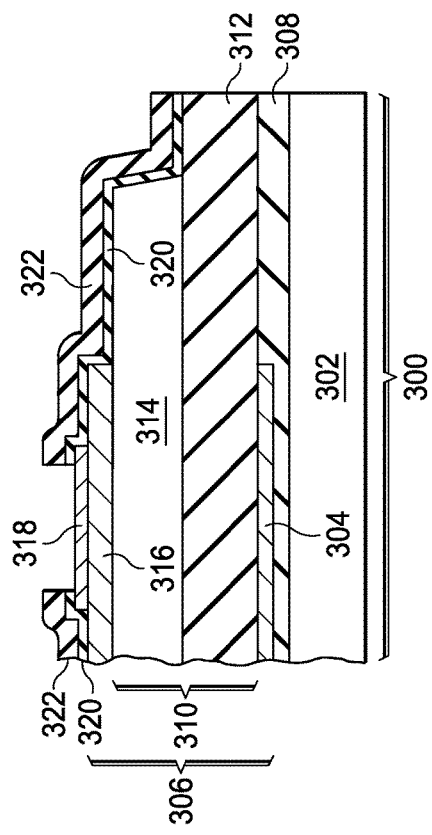
FIG. 4D
FIG. 4E

RELIABILITY IMPROVEMENT OF POLYMER-BASED CAPACITORS BY MOISTURE BARRIER

CROSS-REFERENCE TO RELATED APPLICATIONS

This application claims the benefit of priority under U.S.C. §119(e) of U.S. Provisional Application 62/076,265, filed Nov. 6, 2014, which is hereby incorporated by reference in its entirety.

FIELD OF THE INVENTION

This invention relates to the field of microelectronic devices. More particularly, this invention relates to capacitors with polymer dielectric layers in microelectronic devices.

BACKGROUND OF THE INVENTION

Some capacitors in microelectronic devices include organic polymer material in the capacitor dielectric. In some cases, the organic polymer material provides substantially the complete capacitor dielectric. In other cases, the organic polymer material may be combined with inorganic dielectric material such as silicon dioxide to provide the capacitor dielectric. Organic polymer material typically provides better voltage surge performance than silicon dioxide. Microelectronic devices with capacitors including organic polymer material in the capacitor dielectric are commonly less expensive to fabricate then similar devices with inorganic dielectric material. Unfortunately, organic polymer material in the capacitor dielectric is subject to reliability problems, including reduced breakdown voltage over time, which is commonly estimated by a time dependent dielectric breakdown (TDDB) test. In a TDDB test of a capacitor, a constant stress voltage is applied to the capacitor until leakage current through the capacitor exceeds a specified limit, which is defined as breakdown of the capacitor dielectric. The length of time the stress voltage is applied until breakdown provides an estimate of reliability of the capacitor in a defined operating environment at a prescribed operating voltage.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In pursuit of the invention, the inventors have discovered the source of poor TDDB reliability of microelectronic device capacitors with organic polymer material in the capacitor dielectric, which has been previously unknown, and significantly improved the TDDB reliability. The inventors discovered that water molecules infiltrate the organic polymer material when the microelectronic device is exposed to water vapor in the operating ambient. The water molecules in the organic polymer material cause the poor TDDB reliability, and reducing the water molecule infiltration into the organic polymer material commensurately improves the TDDB reliability. Water molecule infiltration from water vapor in the ambient is effectively reduced by a moisture barrier comprising a layer of aluminum oxide formed by an atomic layer deposition (ALD) process.

DESCRIPTION OF THE VIEWS OF THE DRAWING

FIG. 4A through FIG. 4E are cross sections of the microelectronic device of FIG. 3, depicted in successive stages of an example method of forming the microelectronic device.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
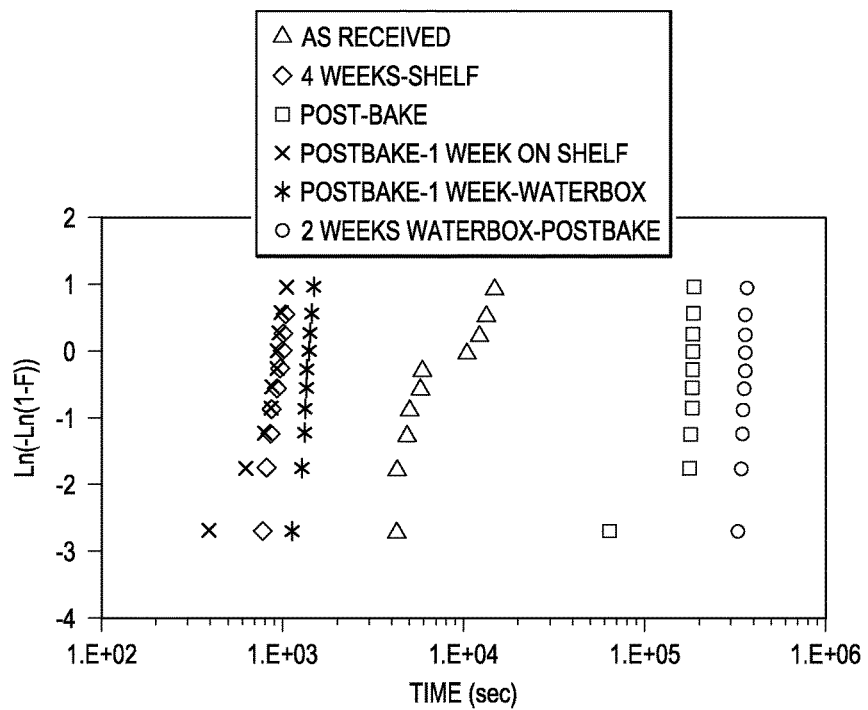
FIG. 1 is a Weibull chart showing results of TDDB tests on a first plurality through a sixth plurality of microelectronic devices including capacitors with polyimide in the capacitor dielectric.

FIG. 1 is a Weibull chart showing results of TDDB tests on a first plurality through a sixth plurality of microelectronic devices including capacitors with polyimide in the capacitor dielectric. The microelectronic devices described in reference to FIG. 1 did not include ALD aluminum oxide moisture barriers. The TDDB tests on the first plurality through the sixth plurality of microelectronic devices were performed at 25° C. with a 5,000 volt stress voltage.

The first plurality of microelectronic devices was subjected to TDDB tests immediately after formation. The capacitors in the first plurality of microelectronic devices exhibited a median TDDB value of about $6 \times 10^3$ seconds. The TDDB values corresponding to the first plurality of microelectronic devices are denoted by "As received" in FIG. 1.

The second plurality of microelectronic devices was stored for 4 weeks exposed to room ambient after formation, and then subjected to TDDB tests. The capacitors in the second plurality of microelectronic devices exhibited a median TDDB value of about 9×10² seconds. The TDDB values corresponding to the second plurality of microelectronic devices are denoted by "4 wks shelf" in FIG. 1. The TDDB values of the second plurality of microelectronic devices relative to the TDDB values of the first plurality of microelectronic devices indicate a significant degradation of the polyimide in the capacitor dielectric during exposure to room ambient.

The third plurality of microelectronic devices was baked after formation to remove water molecules from the polyimide in the capacitor dielectric, and subjected to TDDB tests immediately after being baked. The capacitors in the third plurality of microelectronic devices exhibited a median TDDB value of about 2×10⁵ seconds. The TDDB values corresponding to the third plurality of microelectronic devices are denoted by "post-bake" in FIG. 1. The TDDB values of the third plurality of microelectronic devices relative to the TDDB values of the first plurality of microelectronic devices indicate a significant improvement of the polyimide in the capacitor dielectric after baking to remove water molecules from the polyimide in the capacitor dielectric.

The fourth plurality of microelectronic devices was baked after formation to remove water molecules from the polyimide in the capacitor dielectric, were subsequently stored for 1 week exposed to room ambient, and then subjected to TDDB tests. The capacitors in the fourth plurality of microelectronic devices exhibited a median TDDB value of about 9×10² seconds. The TDDB values corresponding to the fourth plurality of microelectronic devices are denoted by "postbake-1 wk on shelf" in FIG. 1. The TDDB values of the fourth plurality of microelectronic devices relative to the TDDB values of the second plurality of microelectronic devices and to the TDDB values of the third plurality of microelectronic devices indicate the improvement obtained by removing water molecules from the polyimide in the capacitor dielectric may be reversed by subsequent exposure to room ambient.

The fifth plurality of microelectronic devices was baked after formation to remove water molecules from the polyimide in the capacitor dielectric, were subsequently stored for 1 week in a waterbox which provided an ambient with substantially 100 percent relative humidity, and then subjected to TDDB tests. The capacitors in the fifth plurality of microelectronic devices exhibited a median TDDB value of about 1.5×10³ seconds. The TDDB values corresponding to the fifth plurality of microelectronic devices are denoted by "postbake-1 wk-waterbox" in FIG. 1. The TDDB values of the fifth plurality of microelectronic devices relative to the TDDB values of the second plurality of microelectronic devices and to the TDDB values of the third plurality of microelectronic devices indicate the improvement obtained by removing water molecules from the polyimide in the capacitor dielectric may be reversed by subsequent exposure to 100 percent humidity. The TDDB values of the fifth plurality of microelectronic devices relative to the TDDB values of the fourth plurality of microelectronic devices indicate the degradation in TDDB values is due to infiltration of water molecules into the polyimide in the capacitor dielectric.

The sixth plurality of microelectronic devices was stored for 2 weeks after formation in a waterbox which provided an ambient with substantially 100 percent relative humidity, subsequently baked to remove water molecules from the polyimide in the capacitor dielectric, and then subjected to TDDB tests. The capacitors in the sixth plurality of microelectronic devices exhibited a median TDDB value of about 3.5×10⁵ seconds. The TDDB values corresponding to the sixth plurality of microelectronic devices are denoted by "2 wkwaterbox-postbake" in FIG. 1. The TDDB values of the sixth plurality of microelectronic devices relative to the TDDB values of the fifth plurality of microelectronic devices indicate infiltration of water molecules into the polyimide in the capacitor dielectric is reversible.

The TDDB results of the first through sixth plurality of microelectronic devices indicate a major factor in degradation of TDDB reliability is infiltration of water molecules into the polyimide in the capacitor dielectric upon exposure to ambient water vapor. Furthermore, the TDDB results indicate the TDDB reliability may be maintained at a desirably high value if the water in the polyimide can be removed and kept out of the capacitor dielectric.

Figure 2:
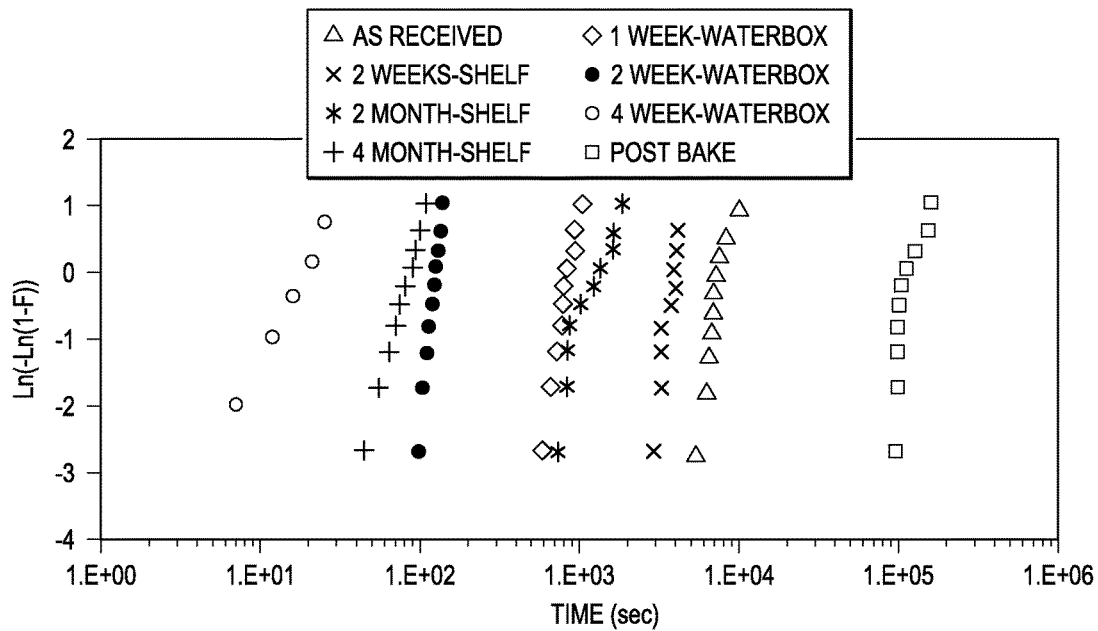
FIG. 2 is a Weibull chart showing results of TDDB tests on a seventh plurality through a fourteenth plurality of microelectronic devices including capacitors with polybenzoxazole (PBO) in the capacitor dielectric.

FIG. 2 is a Weibull chart showing results of TDDB tests on a seventh plurality through a fourteenth plurality of microelectronic devices including capacitors with PBO in the capacitor dielectric. The microelectronic devices described in reference to FIG. 2 did not include ALD aluminum oxide moisture barriers. The TDDB tests on the seventh plurality through the fourteenth plurality of microelectronic devices were performed at 25° C. with a 1,000 volt stress voltage.

The seventh plurality of microelectronic devices was subjected to TDDB tests immediately after formation. The capacitors in the seventh plurality of microelectronic devices exhibited a median TDDB value of about 7×10³ seconds. The TDDB values corresponding to the seventh plurality of microelectronic devices are denoted by "As received" in FIG. 2.

The eighth plurality of microelectronic devices was stored for 2 weeks exposed to room ambient after formation, and then subjected to TDDB tests. The capacitors in the eighth plurality of microelectronic devices exhibited a median TDDB value of about 4×10³ seconds. The TDDB values corresponding to the eighth plurality of microelectronic devices are denoted by "2 wks-shelf" in FIG. 2. The TDDB values of the eighth plurality of microelectronic devices relative to the TDDB values of the seventh plurality of microelectronic devices indicate a significant degradation of the PBO in the capacitor dielectric during exposure to room ambient.

The ninth plurality of microelectronic devices was stored for 2 months exposed to room ambient after formation, and then subjected to TDDB tests. The capacitors in the ninth plurality of microelectronic devices exhibited a median TDDB value of about 1.1×10³ seconds. The TDDB values corresponding to the ninth plurality of microelectronic devices are denoted by "2 month-shelf" in FIG. 2. The TDDB values of the ninth plurality of microelectronic devices relative to the TDDB values of the seventh plurality of microelectronic devices and to the eighth plurality of microelectronic devices indicate the degradation of the PBO in the capacitor dielectric increases with increasingly long exposure to room ambient.

The tenth plurality of microelectronic devices was stored for 4 months exposed to room ambient after formation, and then subjected to TDDB tests. The capacitors in the tenth plurality of microelectronic devices exhibited a median TDDB value of about 8×10¹ seconds. The TDDB values corresponding to the tenth plurality of microelectronic devices are denoted by "4 month-shelf" in FIG. 2. The TDDB values of the tenth plurality of microelectronic devices relative to the TDDB values of the seventh plurality of microelectronic devices, to the eighth plurality of microelectronic devices, and to the ninth plurality of microelectronic devices further indicate the degradation of the PBO in the capacitor dielectric increases with increasingly long exposure to room ambient.

The eleventh plurality of microelectronic devices was stored for 1 week in a waterbox which provided an ambient with substantially 100 percent relative humidity, and then subjected to TDDB tests. The capacitors in the eleventh plurality of microelectronic devices exhibited a median TDDB value of about $8 \times 10^2$ seconds. The TDDB values corresponding to the eleventh plurality of microelectronic devices are denoted by "1 wk-waterbox" in FIG. 2. The TDDB values of the eleventh plurality of microelectronic devices relative to the TDDB values of the seventh plurality of microelectronic devices indicate a significant degradation of the PBO in the capacitor dielectric during exposure to 100 percent humidity.

The twelfth plurality of microelectronic devices was stored for 2 weeks in a waterbox which provided an ambient with substantially 100 percent relative humidity, and then subjected to TDDB tests. The capacitors in the twelfth plurality of microelectronic devices exhibited a median TDDB value of about $1.3 \times 10^2$ seconds. The TDDB values corresponding to the twelfth plurality of microelectronic devices are denoted by "2 wk-waterbox" in FIG. 2. The TDDB values of the twelfth plurality of microelectronic devices relative to the TDDB values of the seventh plurality of microelectronic devices and to the TDDB values of the eleventh plurality of microelectronic devices indicate the degradation of the PBO in the capacitor dielectric increases with increasingly long exposure to 100 percent humidity.

The thirteenth plurality of microelectronic devices was stored for 4 weeks in a waterbox which provided an ambient with substantially 100 percent relative humidity, and then subjected to TDDB tests. The capacitors in the thirteenth plurality of microelectronic devices exhibited a median TDDB value of about $1.6 \times 10^1$ seconds. The TDDB values corresponding to the thirteenth plurality of microelectronic devices are denoted by "4 wk-waterbox" in FIG. 2. The TDDB values of the thirteenth plurality of microelectronic devices relative to the TDDB values of the seventh plurality of microelectronic devices, to the TDDB values of the eleventh plurality of microelectronic devices, and to the TDDB values of the twelfth plurality of microelectronic devices further indicate the degradation of the PBO in the capacitor dielectric increases with increasingly long exposure to 100 percent humidity.

The fourteenth plurality of microelectronic devices was baked after formation to remove water molecules from the PBO in the capacitor dielectric, and subjected to TDDB tests immediately after being baked. The capacitors in the fourteenth plurality of microelectronic devices exhibited a median TDDB value of about $1 \times 10^5$ seconds. The TDDB values corresponding to the fourteenth plurality of microelectronic devices are denoted by "Post-bake" in FIG. 1. The TDDB values of the fourteenth plurality of microelectronic devices relative to the TDDB values of the seventh plurality of microelectronic devices indicate a significant improvement of the PBO in the capacitor dielectric after baking to remove water molecules from the PBO in the capacitor dielectric.

The TDDB results of the seventh through fourteenth plurality of microelectronic devices indicate a major factor in degradation of TDDB reliability is infiltration of water molecules into the PBO in the capacitor dielectric upon exposure to ambient water vapor. Furthermore, the TDDB results indicate the TDDB reliability may be maintained at a desirably high value if the water in the PBO can be removed and kept out of the capacitor dielectric.

Figure 3:
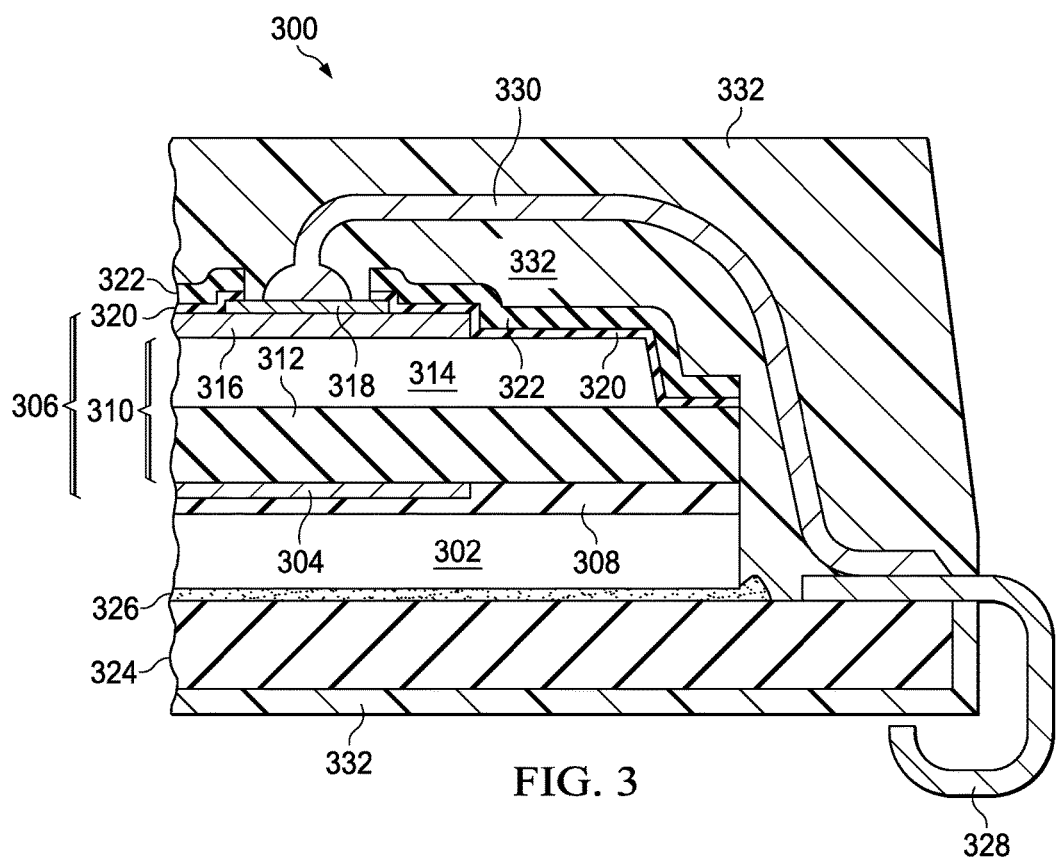
FIG. 3 is a cross section of an example microelectronic device which includes a capacitor with an organic polymer material in a capacitor dielectric of the capacitor.

FIG. 3 is a cross section of an example microelectronic device which includes a capacitor with an organic polymer material in a capacitor dielectric of the capacitor. The microelectronic device 300 includes an inorganic substrate 302, which may include a semiconductor material such as silicon, or may include an insulator material such as glass or ceramic. The microelectronic device 300 includes a first plate 304 of the capacitor 306 disposed above the substrate 302. The first plate 304 may include one or more layers of metal such as aluminum or copper, with appropriate adhesion metal layers, liner metals, and/or cap metal layers. The first plate 304 may be electrically isolated from the substrate 302 by an optional isolation dielectric layer 308 disposed between the substrate 302 and the first plate 304.

The capacitor 306 includes a capacitor dielectric 310 disposed over the first plate 304. In the instant example, the capacitor dielectric 310 may include an optional inorganic dielectric material 312 such as one or more layers of silicon dioxide, silicon nitride, silicon oxide nitride and/or silicon oxide carbide nitride. The capacitor dielectric 310 may include dielectric layers of an interconnect region of the microelectronic device 300. The capacitor dielectric 310 includes an organic polymer material 314 such as polyimide or PBO. In the instant example, the organic polymer material 314 is patterned so as not to extend to an edge of the inorganic dielectric material 312 if present or the substrate 302. Having the inorganic dielectric material 312 and the organic polymer material 314 in the capacitor dielectric 310 may desirably provide both static and transient stress reliability. The inorganic dielectric material 312 provides more static stress reliability than the organic polymer material 314, and the organic polymer material 314 provides more transient stress reliability than the inorganic dielectric material 312.

The capacitor 306 includes a second plate 316 disposed opposite the first plate 304, in the instant example over the capacitor dielectric 310. The second plate 316 may include one or more layers of metal such as aluminum or copper, and may further include adhesion metal layers, liner metals, and/or cap metal layers.

In the instant example, the microelectronic device 300 may include a bond pad 318 disposed on the second plate 316. The bond pad 318 may include one or more layers of nickel, palladium, platinum and or gold.

The microelectronic device 300 includes a moisture barrier 320 disposed over the organic polymer material 314 so as to cover a surface of the organic polymer material 314 which is exposed by the inorganic dielectric material 312, the isolation dielectric layer 308, the substrate 302, and/or the second plate 316. The moisture barrier may overlap the organic polymer material 314 and extend onto the inorganic dielectric material 312 if present and/or the substrate 302. The moisture barrier 320 may be disposed directly on the organic polymer material 314, or there may be a layer of dielectric material between the moisture barrier 320 and the organic polymer material 314, such as an adhesion layer or a planarizing layer. The moisture barrier 320 includes at least one layer of aluminum oxide formed by an ALD process, referred to herein as ALD aluminum oxide. Each layer of ALD aluminum oxide may be, for example, 20 nanometers to 200 nanometers thick. The moisture barrier 320 may include a plurality of alternating layers of ALD aluminum oxide and another dielectric material. The dielectric material alternating with the ALD aluminum oxide may be, for example, an inorganic dielectric material such as silica formed by an ALD process, an organic polymer formed by a molecular deposition process, or a hybrid organic-inorganic polymer formed by an ALD process, as described in US Patent Application Publication US2010/0178481 by George et al. and incorporated herein by reference. Layers of aluminum oxide formed by ALD are distinguished by an amorphous microstructure, high conformality and uniform thickness compared to layers of aluminum oxide formed by other methods such as reactive sputtering.

In the instant example, the microelectronic device 300 may include an optional protective layer 322 disposed over the moisture barrier 320. The protective layer 322 may include one or more layers of silicon dioxide-based material or polymer material. The protective layer 322 may provide protection for the moisture barrier from mechanical damage and from liquid water during formation and assembly of the microelectronic device 300. Liquid water may be present during singulation of the microelectronic device 300 before packaging. Liquid water in contact with the moisture barrier 320 has been demonstrated to degrade the ALD aluminum oxide.

In the instant example, after singulation, the microelectronic device 300 is mounted on a carrier 324 with, for example, die attach adhesive 326 or possibly solder. Leads 328 are attached to the carrier 324 to provide external connections for the microelectronic device 300. A wire bond 330 is formed to electrically connect the bond pad 318 to one of the leads 328.

The microelectronic device 300 may be, for example, an integrated circuit with active components such as transistors, or may be a passive device containing capacitors, resistors and/or inductors. In the instant example, the microelectronic device 300 is encapsulated in a plastic resin 332 as part of the packaging process. The plastic resin may be, for example, an epoxy resin. Other package configurations such as a hermetically sealed ceramic package are within the scope of the instant example.

Forming the moisture barrier 320 so as to seal the organic polymer material 314, in combination with the second plate 316, the inorganic dielectric material 312, the isolation dielectric layer 308 and/or the substrate 302, may significantly reduce infiltration of water molecules into the organic polymer material 314 and thus advantageously provide a significantly improved TDDB reliability compared to a similar microelectronic device without a moisture barrier. Forming the moisture barrier 320 so as to be contained by the package, in the instant example, the plastic resin 332, may advantageously provide mechanical protection for the moisture barrier during use of the microelectronic device 300.

Figure 4A:
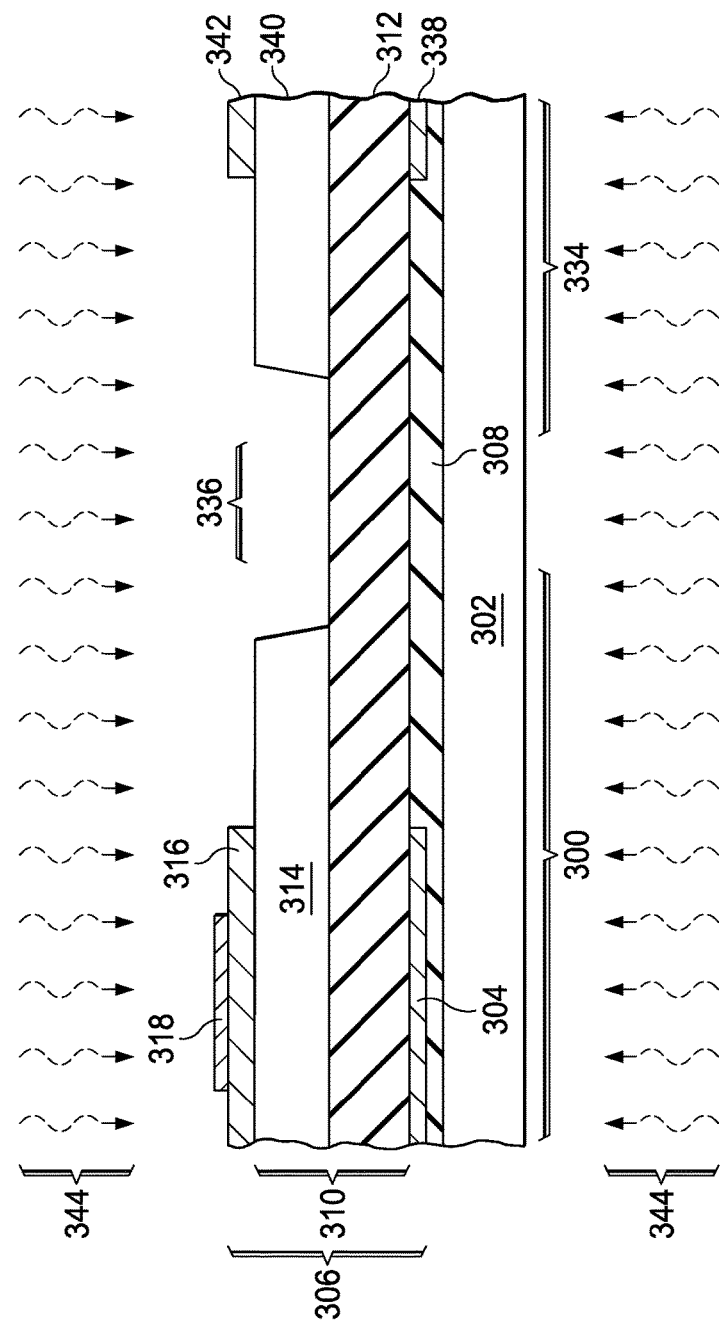

FIG. 4A through FIG. 4E are cross sections of the microelectronic device of FIG. 3, depicted in successive stages of an example method of forming the microelectronic device. Referring to FIG. 4A, the substrate 302 may be part of a silicon wafer or large area ceramic substrate with the microelectronic device 300 and multiple instances of similar microelectronic devices 334, laterally separated by singulation regions 336 such as scribe lines.

The optional isolation dielectric layer 308 may be formed over the substrate 302, and may extend through the singulation regions 336 as depicted in FIG. 4A. The isolation dielectric layer 308 may include one or more layers of silicon dioxide-based dielectric material and/or silicon nitride, formed for example by thermal oxidation of silicon, plasma enhanced chemical vapor deposition (PECVD) processes, low pressure chemical vapor deposition (LPCVD) processes, or other dielectric deposition processes. The isolation dielectric layer 308 may include lower dielectric layers, for example, a pre-metal dielectric (PMD) layer, a intra-metal dielectric (IMD) layer and an inter-level dielectric (ILD) layer, of an interconnect region of the microelectronic device 300.

The first plate 304 is formed over the substrate 302, and over the isolation dielectric layer 308 if present. The first plate 304 may be formed concurrently with first plates 338 in the instances of similar microelectronic devices 334. The first plate 304 may be formed concurrently with metal interconnects of a metallization level of the microelectronic device 300. Alternatively, the first plate 304 may be formed separately from other elements of the microelectronic device 300. In one version of the instant example, the first plate 304 may be formed by etching a layer of aluminum masked by a photoresist pattern. In another version, the first plate 304 may be formed by a copper damascene process. In a further version, the first plate 304 may be formed by electroplating copper on a seed layer through a plating mask. Other methods of forming the first plate are within the scope of the instant example.

The optional inorganic dielectric material 312 of the capacitor dielectric 310 may be formed over the first plate 304. The inorganic dielectric material 312 may be formed as one or more layers of dielectric material, for example silicon dioxide-based dielectric material, formed, for example, by PECVD processes. The inorganic dielectric material 312 may include dielectric layers of an interconnect region of the microelectronic device 300.

The organic polymer material 314 is formed over the first plate 304, on the inorganic dielectric material 312 if present. The organic polymer material 314 may be formed concurrently with organic polymer materials 340 in the instances of similar microelectronic devices 334. The organic polymer material 314 may include, for example, polyimide or PBO. The organic polymer material 314 may be formed by spin coating a photosensitive formulation of polymer, removing volatile material with a bake, then exposing the polymer by a photolithographic process, followed by a develop process to remove unwanted polymer material. A final thermal cure may provide desired chemical properties for the organic polymer material 314. Alternatively, the organic polymer material 314 may be formed by spin coating a non-photosensitive formulation of polymer, removing volatile material with a bake, forming a photoresist mask over the polymer, removing unwanted polymer with an etch process, and removing the mask, possibly followed by an optional thermal cure. In the instant example, the organic polymer material 314 is patterned to terminate on the inorganic dielectric material 312 if present, or possibly on the isolation dielectric layer 308 or the substrate 302, to provide a good seal for the subsequently formed moisture barrier 320 of FIG. 1.

The second plate 316 is formed over the organic polymer material 314, opposite from the first plate 304. The second plate 316 may be formed concurrently with second plates 342 in the instances of similar microelectronic devices 334. The second plate 316 may include one or more layers of metal such as aluminum or copper, possibly with an adhesion metal layer and/or a cap metal layer. The second plate 316 may be formed by depositing a layer of metal, forming an etch mask over the layer of metal, etching the layer of metal where exposed by the etch mask to form the second plate 316, and removing the mask. Alternatively, the second plate 316 may be formed by depositing a seed metal layer, forming a plating mask on the seed layer metal, electroplating on the seed metal layer where exposed by the plating mask to form the second plate 316, subsequently removing the plating mask and the seed metal layer where exposed by the second plate 316.

The bond pad 318 is formed over, and electrically connected to, the second plate 316. The bond pad 318 may include one or more layers of metal such as aluminum, copper, nickel, palladium, platinum and/or gold. The bond pad 318 may be formed by any of various methods. The bond pad 318 may be formed by sputtering or evaporating layers of metal over the second plate 316, forming an etch mask over the layers of metal and removing the layers of metal where exposed by the etch mask to leave the bond pad 318, and subsequently removing the etch mask. The bond pad 318 may be formed by electroplating or electroless plating layers of metal on the second plate 316.

After the second plate 316 is formed, and possibly after the bond pad 318 is formed, the microelectronic device 300 may be optionally baked to remove water molecules from the organic polymer material 314. The microelectronic device 300 may be baked using an infrared heat source 344 as depicted schematically in FIG. 4A. Alternatively, the microelectronic device 300 may be baked using a batch oven or a hot plate. The microelectronic device 300 may be disposed in a vacuum or a dry ambient while being baked to facilitate removal of the water molecules. A thermal profile of the bake process may be selected depending on a thickness of the organic polymer material 314. Other methods of removing water molecules from the organic polymer material 314, such as prolonged exposure to vacuum, are within the scope of the instant example.

Figure 4B:
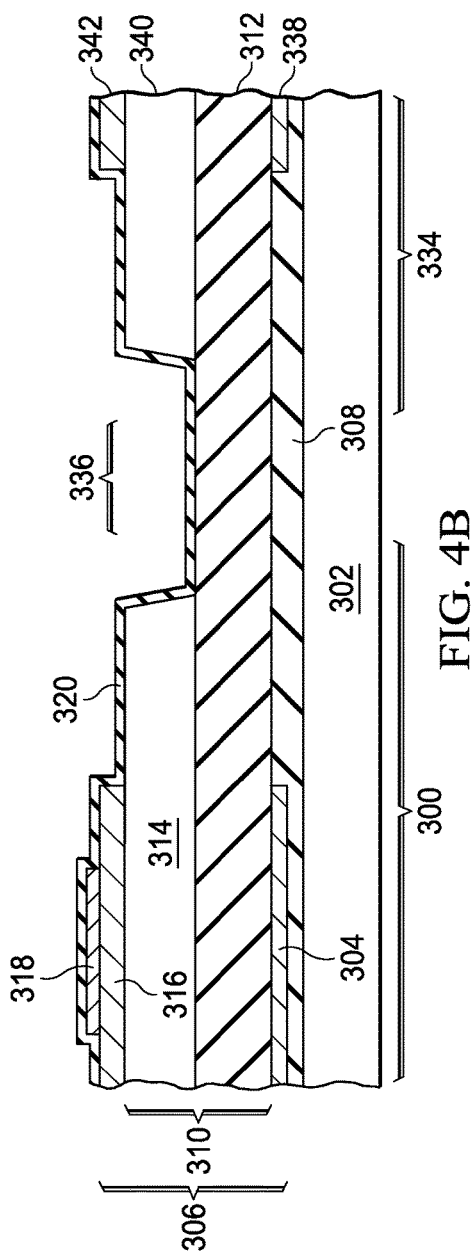

Referring to FIG. 4B, the moisture barrier 320 is formed over the organic polymer material 314. The moisture barrier 320 may be formed while the organic polymer material 314 is free of water molecules to a desired level, for example immediately after the bake process described in reference to FIG. 4A. The moisture barrier 320 includes at least one layer of aluminum oxide formed by an ALD process. The ALD process for the aluminum oxide may comprise forming a layer of an aluminum precursor such as trimethyl aluminum, followed by exposing the layer of the aluminum precursor to an oxidizing reagent such as water. Other ALD processes for forming the layer or layers of aluminum oxide are within the scope of the instant example. The moisture barrier 320 may include an adhesion layer between the aluminum oxide layer and the organic polymer material 314. The moisture barrier 320 may include a cap layer. The moisture barrier 320 may be formed by sequential ALD processes to form a plurality of alternating layers of ALD aluminum oxide and silica, as described in US Patent Application Publication US2010/0178481, previously cited. The moisture barrier 320 may be formed by sequential ALD processes and molecular layer deposition processes to form a plurality of alternating layers of ALD aluminum oxide and an organic polymer, also as described in US Patent Application Publication US2010/0178481. The moisture barrier 320 may be formed by sequential ALD processes to form a plurality of alternating layers of ALD aluminum oxide and a hybrid organic-inorganic polymer, further described in US Patent Application Publication US2010/0178481. Forming the plurality of alternating layers of ALD aluminum oxide and silica, an organic polymer or a hybrid organic-inorganic polymer has been demonstrated to provide durability for the moisture barrier 320 during temperature stress cycle tests, for example repeated cycles to 380° C. to simulate wave soldering. Forming the plurality of alternating layers of ALD aluminum oxide and another dielectric material has been shown to provide improved resistance to water molecule infiltration on surfaces of the organic polymer material 314 which have been roughened by multiple ash processes, for example descum ash processes.

Figure 4C:
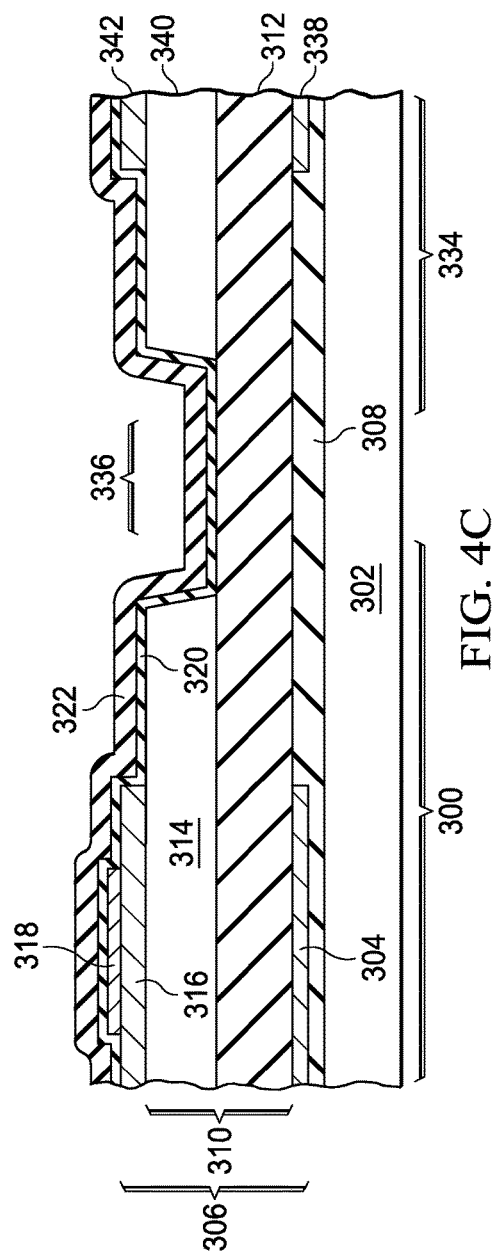

Referring to FIG. 4C, the optional protective layer 322 may be formed over the moisture barrier 320. The protective layer 322 may be formed by one or more conformal thin film processes, such as PECVD, vapor transport and/or ALD. The PECVD process may provide a layer of silicon dioxide-based dielectric material. The vapor transport process may provide a layer of parylene. The ALD process may provide a layer of silica or other protective material.

Referring to FIG. 4D, a bond pad mask 346 is formed over a top surface of the microelectronic device 300 which exposes a portion of the bond pad 318. The bond pad mask 346 may include photoresist formed by a photolithographic process. The protective layer 322 and the moisture barrier 320 are removed from over the bond pad 318, for example by a reactive ion etch (RIE) process. The RIE process may include several successive etching steps with different chemistries to remove the several layers of different composition in the protective layer 322 and the moisture barrier 320. The bond pad mask 346 is subsequently removed, for example by an ash process. A top bonding layer of gold may be formed by electroless plating on the bond pad 318 where exposed by the moisture barrier 320.

Referring to FIG. 4E, the microelectronic device 300 is singulated, for example by scribing or sawing through the singulation regions 336 of FIG. 4D. The moisture barrier 320 covers edges of the organic polymer material 314 and extends onto the inorganic dielectric material 312 and/or the substrate 302 proximate to edges of the microelectronic device 300. The protective layer 322 may advantageously prevent liquid water from contacting the moisture barrier 320 during the singulation process, which commonly uses water for cooling. After singulation, the microelectronic device 300 may be packaged and assembled, for example to provide the structure of FIG. 3.

Figure 5A:
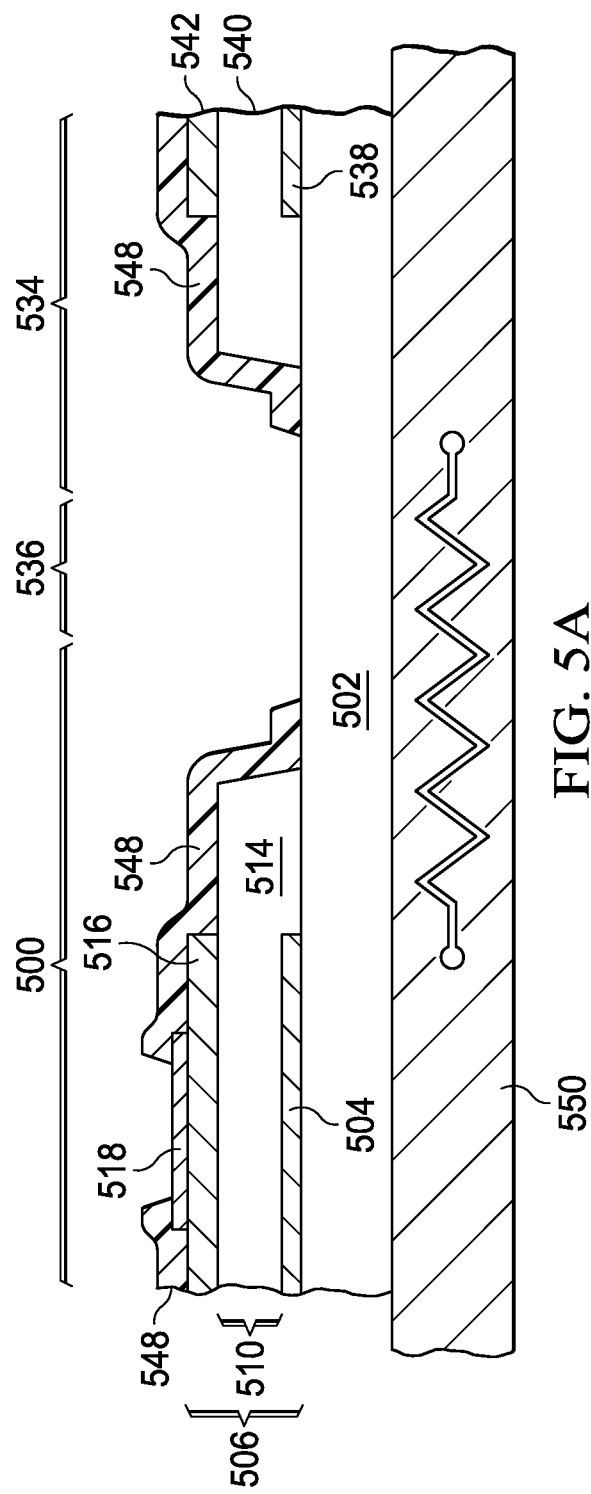
FIG. 5A through FIG. 5C are cross sections of another example microelectronic device, depicted in successive stages of an example method of formation.
Figure 5B:
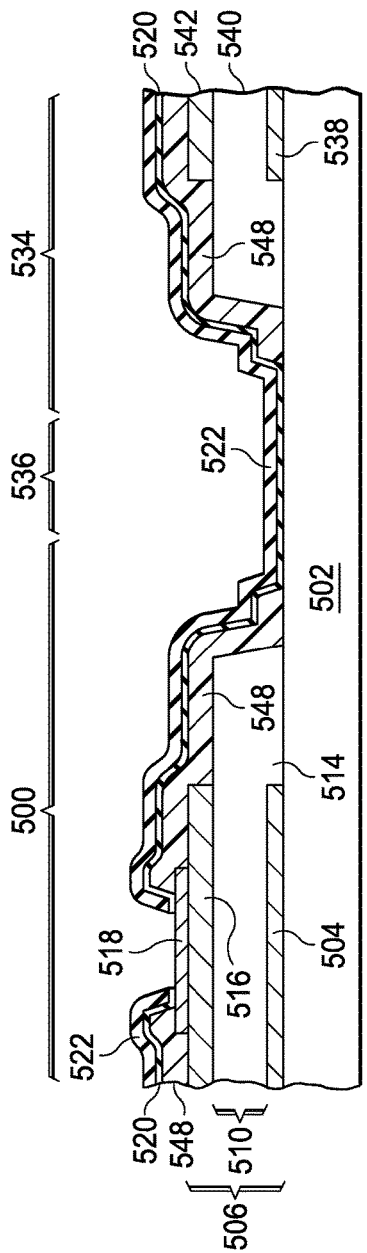
Figure 5C:
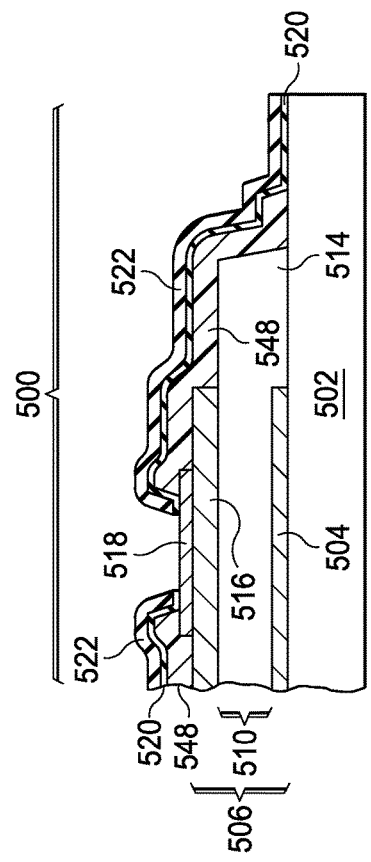

FIG. 5A through FIG. 5C are cross sections of another example microelectronic device, depicted in successive stages of an example method of formation. Referring to FIG. 5A, a substrate 502, which may be part of a large area ceramic substrate or other insulating material, has areas for the microelectronic device 500 and multiple instances of similar microelectronic devices 534, laterally separated by singulation regions 536 such as scribe lines. In the instant example, a first plate 504 of a capacitor 506 may be formed on the substrate 502, as depicted in FIG. 5A. Alternatively, the substrate 502 may be a semiconductor wafer, and an isolation dielectric layer, not shown in FIG. 5A, may be formed on the substrate 502 to electrically isolate the first plate 504 from the substrate, for example as described for the optional isolation dielectric layer 308 in reference to FIG. 4A. The first plate 504 may be formed concurrently with first plates 538 in the instances of similar microelectronic devices 534.

In the instant example, an organic polymer material 514 is formed over the first plate 504 to provide a capacitor dielectric 510 of the capacitor 506. The organic polymer material 514 may include polyimide or PBO, and may be formed as described in reference to FIG. 4A. Forming the capacitor dielectric 510 substantially of the organic polymer material 514 may advantageously reduce a fabrication cost of the microelectronic device 500 compared to a more complex capacitor dielectric. Alternatively, the capacitor dielectric 510 may include an inorganic dielectric material, not shown in FIG. 5A, for example as described for the optional inorganic dielectric material 312 in reference to FIG. 4A. In the instant example, the organic polymer material 514 is patterned to terminate on the substrate 502 to provide a good seal for a subsequently formed moisture barrier. The organic polymer material 514 may be formed concurrently with organic polymer materials 540 in the instances of similar microelectronic devices 534.

A second plate 516 is formed over the capacitor dielectric 510, opposite from the first plate 504. The second plate 516 may be formed concurrently with second plates 542 in the instances of similar microelectronic devices 534. The second plate 516 may be formed as described in reference to FIG. 4A. An optional bond pad 518 may be formed over, and electrically connected to, the second plate 516, for example as described in reference to FIG. 4A.

In an alternate version of the instant example, the first plate 504 and the second plate 516 may have more complicated configurations, such as interleaved tines in a same metallization level, or interleaved plates spanning multiple metallization levels, in which the organic polymer material 514 provides dielectric isolation for the metallization levels. Other capacitor configurations using the organic polymer material 514 in the capacitor dielectric 510 are within the scope of the instant example.

In the instant example, an overcoat layer 548 may be formed over the capacitor 506, extending onto, and terminating on, the substrate 502. The overcoat layer 548 may include, for example, one or more layers of polyimide, PBO, silicon dioxide, silicon nitride and/or silicon oxide nitride. In the instant example, the overcoat layer 548 extends onto, and exposes a center portion of, the bond pad 518. The overcoat layer 548 may be formed directly by a photolithographic process using photosensitive polyimide or photosensitive PBO. Alternatively, the overcoat layer 548 may be formed by forming one or more conformal layers over the capacitor 506, forming an etch mask over the conformal layers, removing unwanted material from the conformal layers where exposed by the etch mask, and subsequently removing the etch mask.

After the overcoat layer 548 is formed, the microelectronic device 500 may be optionally baked to remove water molecules from the organic polymer material 514. The microelectronic device 500 may be baked using a hot plate 550, as depicted in FIG. 5A, or may be baked by other methods. A thermal profile of the bake process may be selected depending on a thickness of the organic polymer material 514. Other methods of removing water molecules from the organic polymer material 514, such as prolonged exposure to vacuum, are within the scope of the instant example.

Referring to FIG. 5B, a moisture barrier 520 is formed over the overcoat layer 548, extending onto the bond pad 518 if present and onto the substrate 502 so as to cover and seal the overcoat layer 548 and the organic polymer material 514. The moisture barrier 520 includes one or more layers of aluminum oxide formed by an ALD process. The bond pad 518 may be formed as described in reference to FIG. 4B. An optional protective layer 522 may be formed over the moisture barrier 520, for example as described in reference to FIG. 4B.

Referring to FIG. 5C, the microelectronic device 500 is singulated through the singulation regions 536 of FIG. 5B. The moisture barrier 520 covers edges of the organic polymer material 514 and extends onto the substrate 502. The protective layer 522 may advantageously prevent liquid water from contacting the moisture barrier 520 during the singulation process. After singulation, the microelectronic device 500 may be assembled and packaged. The protective layer 522 may advantageously protect the moisture barrier 520 from mechanical damage during assembly and packaging.

Figure 6A:
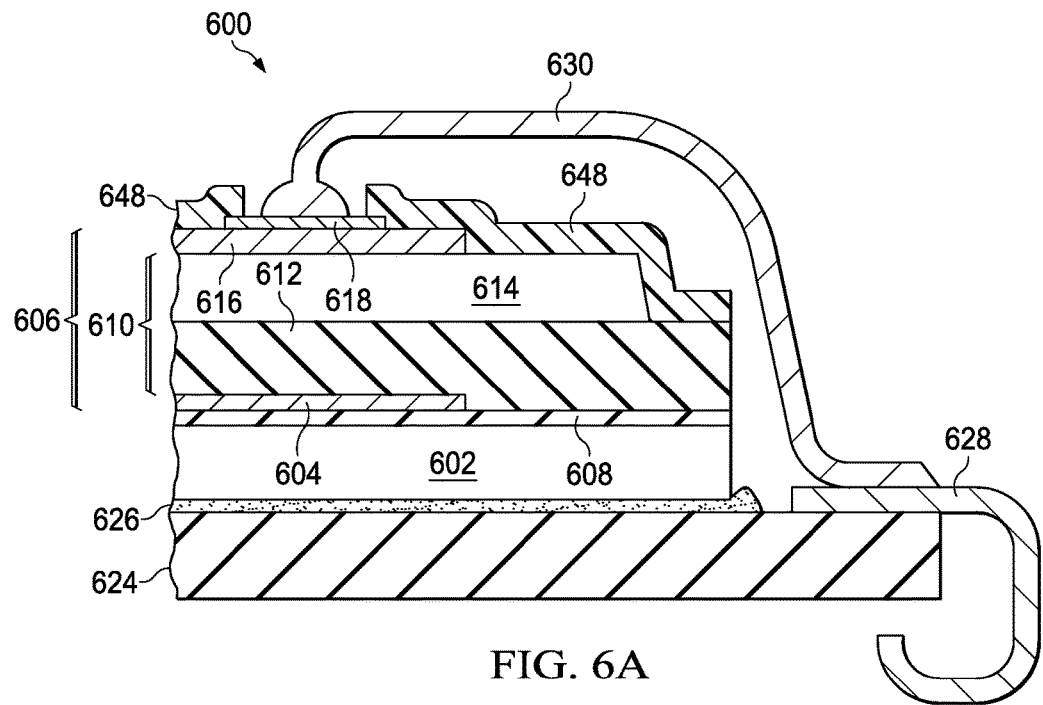
FIG. 6A through FIG. 6D are cross sections of another example microelectronic device, depicted in successive stages of an example method of formation.

FIG. 6A through FIG. 6D are cross sections of another example microelectronic device, depicted in successive stages of an example method of formation. Referring to FIG. 6A, the microelectronic device 600 includes a substrate 602 of inorganic material, which may include a semiconductor material such as silicon, or may include an insulator material such as glass or ceramic. The microelectronic device 600 includes a capacitor 606 having a first plate 604, a capacitor dielectric 610, and a second plate 616 disposed opposite the first plate 604. In the instant example, the capacitor dielectric 610 includes an optional inorganic dielectric material 612 and an organic polymer material 614. Alternatively, the capacitor dielectric 610 may be free of the inorganic dielectric material 612. The first plate 604, the second plate 616 and the capacitor dielectric 610 may be formed as described in reference to the examples disclosed herein. In the instant example, the microelectronic device 600 may include a bond pad 618 disposed on the second plate 616. In the instant example, an overcoat layer 648 may be formed over the capacitor 606. The overcoat layer 648 may include, for example, one or more layers of organic polymer or inorganic dielectric material. In the instant example, the overcoat layer 648 extends onto, and exposes a center portion of, the bond pad 618.

The microelectronic device 600 is mounted on a carrier 624 with die attach material 626. Leads 628 are attached to the carrier 624 to provide external connections for the microelectronic device 600. A wire bond 630 is formed to electrically connect the bond pad 618 to one of the leads 628.

Figure 6B:
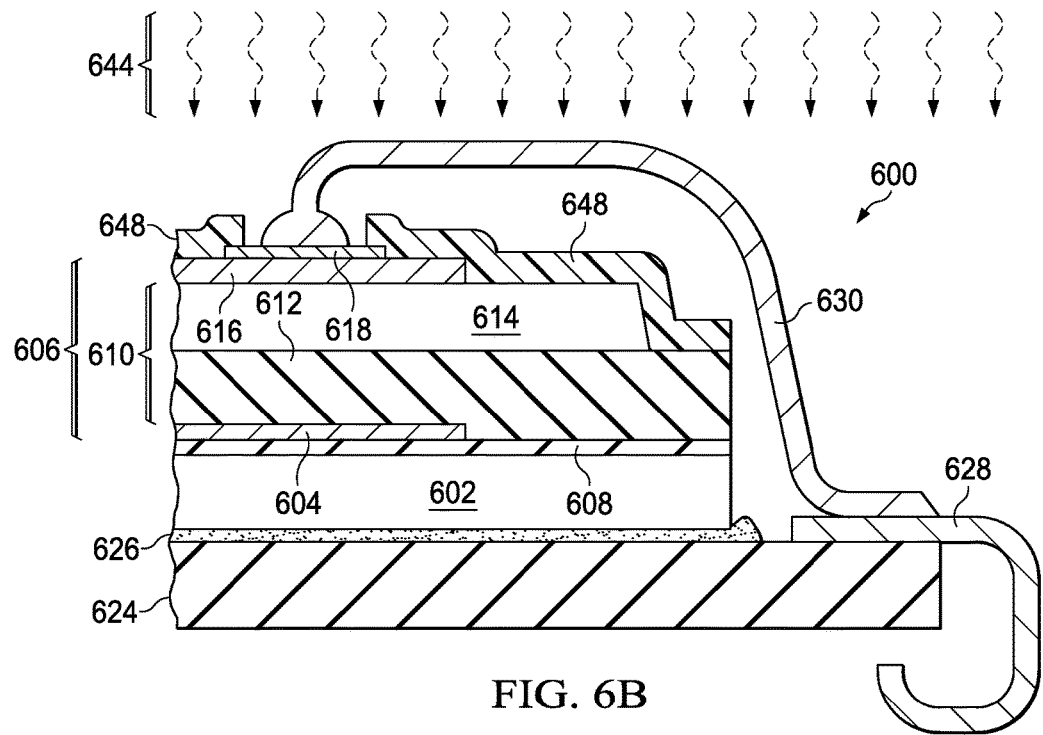

Referring to FIG. 6B, the assembled microelectronic device 600 may be optionally baked to remove water molecules from the organic polymer material 614. The microelectronic device 600 may be baked by radiant heat 644 as depicted in FIG. 6B, or by other methods. A thermal profile of the bake process may be selected depending on thicknesses of the organic polymer material 614 and the overcoat layer 648. Other methods of removing water molecules from the organic polymer material 614 are within the scope of the instant example.

Figure 6C:
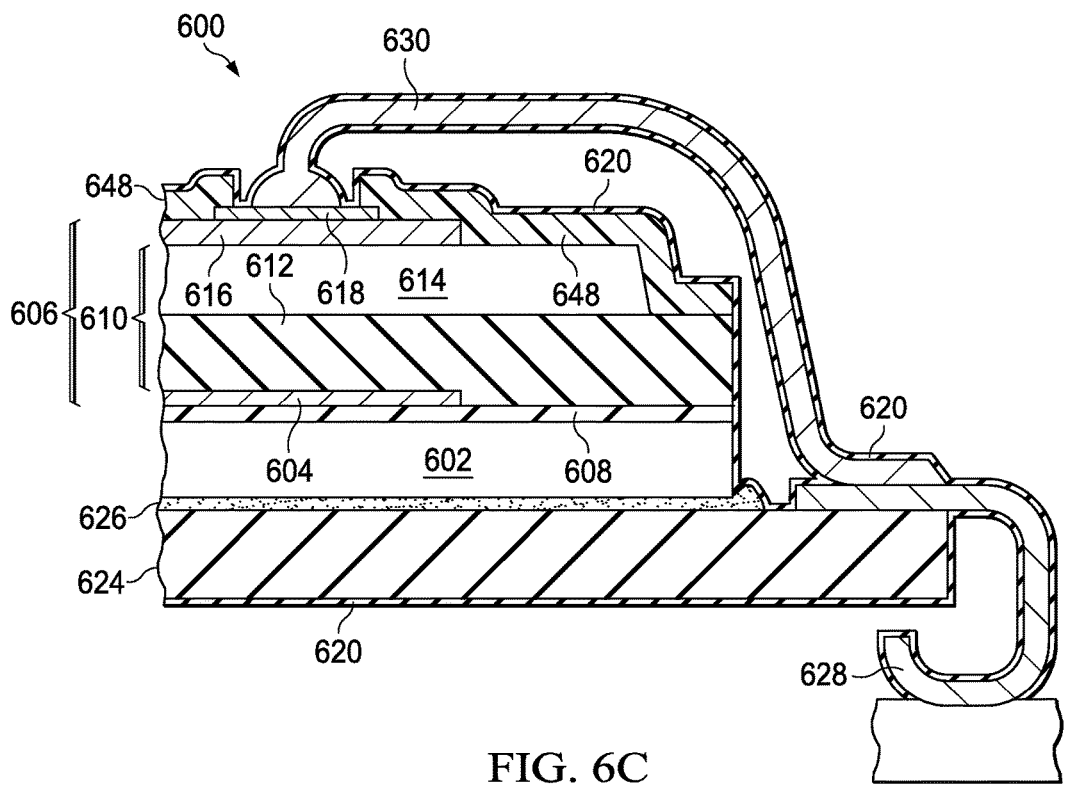

Referring to FIG. 6C, a moisture barrier 620 is formed on the microelectronic device 600, covering exposed surfaces of the organic polymer material 614 and the overcoat layer 648. The moisture barrier 620 may be formed as described in reference to FIG. 4B. Multiple layers of aluminum oxide in the moisture barrier 620 may be particularly effective in the instant example, so as to cover the complex surface of the assembled microelectronic device 600. An optional protective layer, not shown in FIG. 6C, may be formed over the moisture barrier 620. The moisture barrier 620 may be blocked from solder areas of the leads 628, or the moisture barrier 620 may be removed from the solder areas afterward. Forming the moisture barrier 620 on the assembled microelectronic device 600 may advantageously provide capability to accommodate a variety of microelectronic devices from a plurality of fabrication lines, which may not have capabilities to form moisture barriers during fabrication as described in reference to FIG. 4A through FIG. 4E and FIG. 5A through FIG. 5C.

Figure 6D:
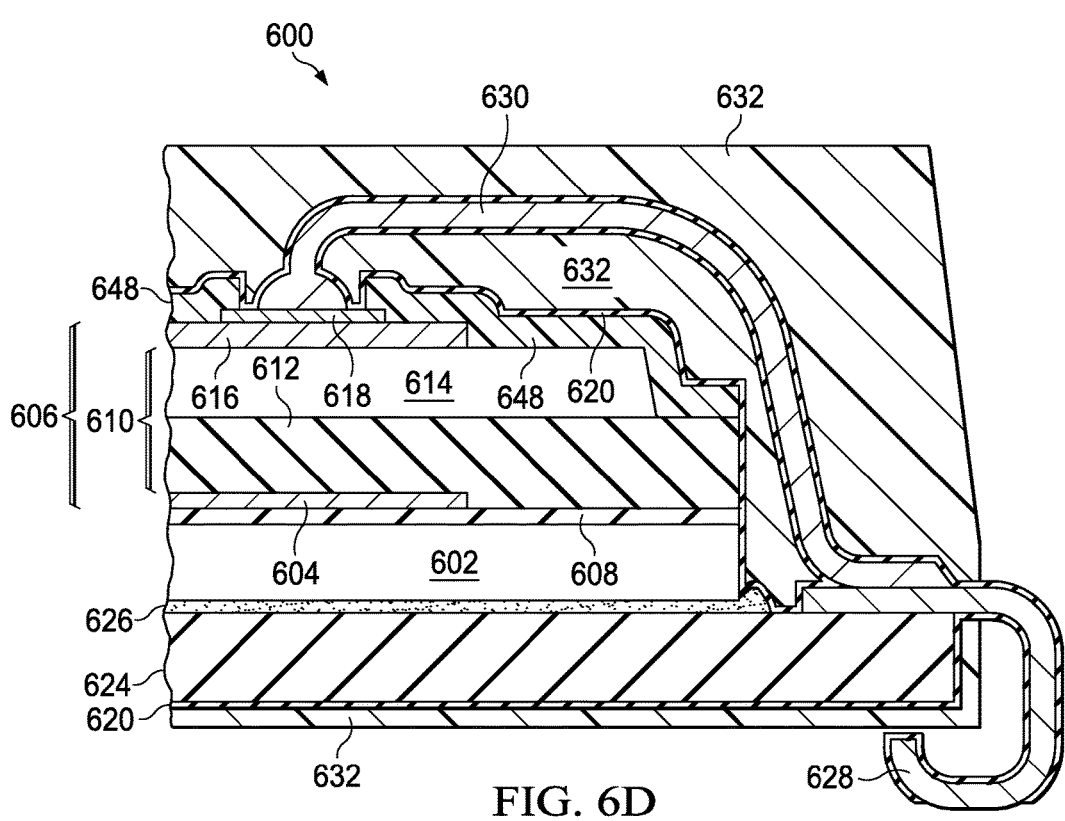

Referring to FIG. 6D, the microelectronic device 600 is packaged, for example by encapsulating with a plastic resin 632. Other package configurations such as a hermetically sealed ceramic package are within the scope of the instant example. The moisture barrier 620 is covered by the package material, which in the instant example is the plastic resin 632, thereby protecting the moisture barrier 620 from mechanical damage and from liquid water.

Figure 7:
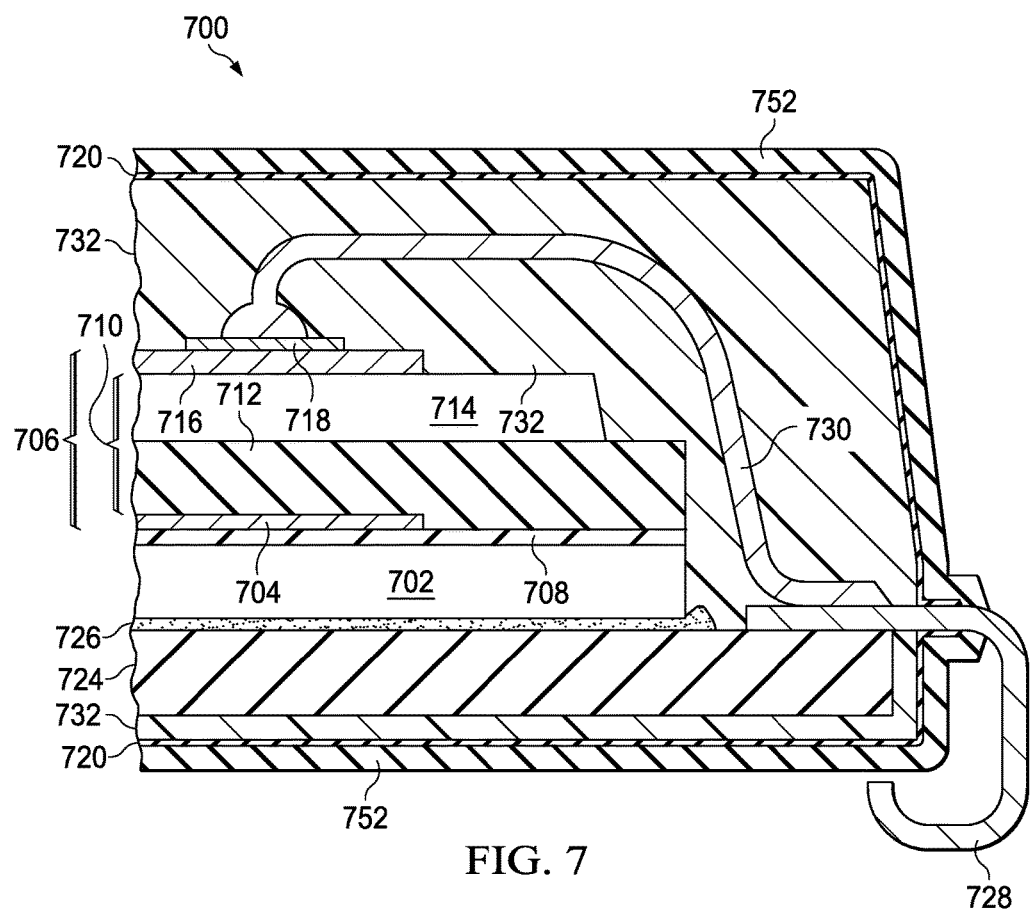
FIG. 7 is a cross section of a further example microelectronic device.

FIG. 7 is a cross section of a further example microelectronic device. The microelectronic device 700 includes a substrate 702 of inorganic material. The microelectronic device 700 includes a capacitor 706 having a first plate 704, a capacitor dielectric 710, and a second plate 716 disposed opposite the first plate 704. In the instant example, the capacitor dielectric 710 may be free of inorganic dielectric material. In an alternate version of the instant example, the capacitor dielectric 710 may include an inorganic dielectric material with the organic polymer material 714. The first plate 704, the second plate 716 and the capacitor dielectric 710 may be formed as described in reference to the examples disclosed herein. In the instant example, the microelectronic device 700 may include a bond pad 718 disposed on the second plate 716. Optionally, an overcoat layer, not shown in FIG. 7, may be formed over the capacitor 706.

The microelectronic device 700 is mounted on a carrier 724 with die attach material 726. Leads 728 are attached to the carrier 724 to provide external connections for the microelectronic device 700. A wire bond 730 is formed to electrically connect the bond pad 718 to one of the leads 728. The microelectronic device 700 is packaged, for example by encapsulating with a plastic resin 732. Other package configurations are within the scope of the instant example.

A moisture barrier 720 is formed on the microelectronic device 700, covering the package, in the instant example, the plastic resin 732. The moisture barrier 720 may be formed as described in reference to FIG. 4B. Multiple layers of aluminum oxide in the moisture barrier 720 may be particularly effective in the instant example, so as to cover the complex surface of the packaged microelectronic device 700. A protective layer 752 is formed over the moisture barrier 720. The protective layer 752 may advantageously reduce mechanical damage and liquid water exposure to the moisture barrier 720. The moisture barrier 720 and the protective layer 752 may be blocked from solder areas of the leads 728, or the moisture barrier 720 may be removed from the solder areas afterward. Forming the moisture barrier 720 on the packaged microelectronic device 700 may advantageously provide capability to accommodate a variety of microelectronic devices from a plurality of fabrication and assembly lines, which may not have capabilities to form moisture barriers during fabrication and assembly.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A microelectronic device, comprising:
   a substrate of inorganic material;
   a capacitor, comprising:
      a first plate disposed above the substrate;
      a second plate disposed above the substrate; and
      a capacitor dielectric comprising an organic polymer material and an inorganic dielectric material disposed between the first plate and the second plate; and
   a moisture barrier disposed over the capacitor, the moisture barrier comprising a layer of aluminum oxide having an amorphous microstructure, wherein the moisture barrier extends over a horizontal surface of the second plate, over a horizontal surface of the organic polymer material that extends beyond the second plate, and over a horizontal surface of the inorganic dielectric material that extends beyond the organic polymer material.

2. The microelectronic device of claim 1, the organic polymer material comprising polyimide.

3. The microelectronic device of claim 1, the organic polymer material comprising polybenzoxazole (PBO).

4. The microelectronic device of claim 1, comprising a protective layer disposed over the moisture barrier, the protective layer comprising a silicon dioxide-based dielectric material.

5. The microelectronic device of claim 1, the moisture barrier comprising a plurality of alternating layers of aluminum oxide having an amorphous microstructure and layers of dielectric material.

6. The microelectronic device of claim 1, the moisture barrier extending onto the inorganic dielectric material.

7. The microelectronic device of claim 1, the moisture barrier extending onto the substrate.

8. The microelectronic device of claim 1, the microelectronic device comprising a bond pad electrically connected to the second plate, the moisture barrier extending partially over the bond pad.

9. The microelectronic device of claim 1, the microelectronic device comprising an overcoat layer of dielectric material disposed over the capacitor and under the moisture barrier.

10. The microelectronic device of claim 1, the moisture barrier being disposed under a plastic encapsulation material forming at least a portion of a package of the microelectronic device.

11. A method of forming a microelectronic device, comprising the steps:
   providing a substrate of inorganic material;
   forming a capacitor of the microelectronic device, comprising:
      forming a first plate above the substrate;
      forming a second plate above the substrate;
      forming a capacitor dielectric comprising an organic polymer material and an inorganic dielectric material between the first plate and the second plate, wherein the organic polymer extends beyond an edge of the second plate and the inorganic dielectric material extends beyond an edge of the organic polymer; and
   forming a moisture barrier over the capacitor, comprising forming a layer of aluminum oxide by an atomic layer deposition (ALD) process.

12. The method of claim 11, the organic polymer material comprising polyimide.

13. The method of claim 11, the organic polymer material comprising PBO.

14. The method of claim 11, wherein forming the moisture barrier comprises forming a plurality of alternating layers of aluminum oxide by an ALD process and layers of dielectric material.

15. The method of claim 11, comprising forming a protective layer over the moisture barrier, the protective layer comprising a silicon dioxide-based dielectric material.

16. The method of claim 11, comprising baking the capacitor dielectric before forming the moisture barrier.

\* \* \* \* \*